(12) United States Patent
Lee (10) Patent No.: US 10,248,501 B2
(45) Date of Patent: Apr. 2, 2019

(54) DATA STORAGE APPARATUS AND OPERATION METHOD THEREOF

(71) Applicant: SK hynix Inc., Gyeonggi-do (KR)

(72) Inventor: Jae Yoon Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 64 days.

(21) Appl. No.: 15/701,718

(22) Filed: Sep. 12, 2017

(65) Prior Publication Data

US 2018/0107540 A1  Apr. 19, 2018

(30) Foreign Application Priority Data

Oct. 18, 2016 (KR) .................. 10-2016-0135097
Aug. 18, 2017 (KR) .................. 10-2017-0104624

(51) Int. Cl.
| | | |
|---|---|---|
| G06F 11/10 | (2006.01) | |
| G11C 29/52 | (2006.01) | |
| G11C 11/56 | (2006.01) | |
| G11C 16/26 | (2006.01) | |
| G11C 16/34 | (2006.01) | |
| G11C 16/30 | (2006.01) | |

(Continued)

(52) U.S. Cl.
CPC ...... G06F 11/1068 (2013.01); G11C 11/5642 (2013.01); G11C 16/26 (2013.01); G11C 16/3431 (2013.01); G11C 29/52 (2013.01); G11C 16/0483 (2013.01); G11C 16/08 (2013.01); G11C 16/30 (2013.01)

(58) Field of Classification Search
CPC . G06F 11/1068; G11C 11/5642; G11C 16/26; G11C 16/3431; G11C 29/52; G11C 16/0483; G11C 16/08; G11C 16/30
USPC ... 714/764, 768–770, 773, 799, 742, 25, 42, 714/47.2, 48, 54; 365/200, 201, 185.02, 365/185.09, 185.24, 185.29, 185.3
See application file for complete search history.

(56) References Cited

U.S. PATENT DOCUMENTS 7,663,948 B2 * 2/2010 Mori .................. G11C 29/83
365/196
7,684,239 B2 * 3/2010 Kang ................ G11C 11/5642
365/185.03

(Continued)

FOREIGN PATENT DOCUMENTS

KR  1020150014510  2/2015

Primary Examiner — John J Tabone, Jr.
(74) Attorney, Agent, or Firm — IP & T Group LLP (57) ABSTRACT

An operation method of a data storage apparatus includes performing a first read operation using an optimal read voltage on read-failed memory cells, performing ECC decoding operation on read data, performing a second read operation using an oversampling read voltage on the read-failed memory cells when the ECC decoding operation fails, determining whether potential error memory cells which are turned on through the optimal read voltage and are turned off through the oversampling read voltage are present in the read data, determining whether neighboring memory cells which share a bit line with the potential error memory cells and are coupled to neighboring word lines are in erased state when the potential error memory cells are present, and inverting bit values corresponding to the potential error memory cells in the read data from the read-failed memory cells through the first read operation when neighboring memory cells are in erased state.

13 Claims, 10 Drawing Sheets

(51) Int. Cl.
*G11C 16/08* (2006.01)
*G11C 16/04* (2006.01)

(56) References Cited

U.S. PATENT DOCUMENTS

| | | | | |
|---|---|---|---|---|
| 7,975,192 | B2* | 7/2011 | Sommer | G06F 11/1068 |
| | | | | 714/719 |
| 8,111,568 | B2* | 2/2012 | Park | G11C 29/40 |
| | | | | 365/201 |
| 8,149,618 | B2* | 4/2012 | Kang | G11C 16/26 |
| | | | | 365/185.03 |
| 9,342,401 | B2* | 5/2016 | Yang | G11C 16/10 |
| 9,570,189 | B1* | 2/2017 | Lee | G11C 16/3404 |
| 9,798,614 | B2* | 10/2017 | Kim | G06F 11/1012 |
| 9,852,804 | B2* | 12/2017 | Park | G11C 16/10 |
| 10,102,059 | B2* | 10/2018 | Hong | G11C 16/26 |
| 10,170,201 | B2* | 1/2019 | Kim | G11C 29/52 |
| 2008/0074939 | A1* | 3/2008 | Mori | G11C 29/83 |
| | | | | 365/203 |
| 2010/0054061 | A1* | 3/2010 | Park | G11C 29/40 |
| | | | | 365/200 |
| 2010/0165730 | A1* | 7/2010 | Sommer | G06F 11/1068 |
| | | | | 365/185.03 |
| 2013/0031431 | A1* | 1/2013 | Sharon | G06F 11/1072 |
| | | | | 714/719 |
| 2015/0082120 | A1* | 3/2015 | Yang | G11C 16/10 |
| | | | | 714/764 |
| 2016/0378596 | A1* | 12/2016 | Kim | G06F 11/1012 |
| | | | | 714/755 |
| 2017/0091039 | A1* | 3/2017 | Hong | G11C 16/26 |
| 2017/0154657 | A1* | 6/2017 | Kim | G11C 7/00 |
| 2018/0047444 | A1* | 2/2018 | Pignatelli | G11C 29/76 |

* cited by examiner

DATA STORAGE APPARATUS AND OPERATION METHOD THEREOF

CROSS-REFERENCES TO RELATED APPLICATION

The present application claims priority under 35 U.S.C. § 119(a) to Korean application number 10-2016-0135097, filed on Oct. 18, 2016, and Korean application number 10-2017-0104624, filed on Aug. 18, 2017, in the Korean Intellectual Property Office, which is incorporated herein by reference in its entirety.

BACKGROUND

1. Technical Field

Various embodiments may generally relate to a semiconductor apparatus, and more particularly, to a data storage apparatus and an operation method thereof.

2. Related Art

In recent years the paradigm for computer environments changed to ubiquitous computing which may use computer systems every time everywhere. As a result, use of portable electronic apparatuses such as a mobile phone, a digital camera, and a laptop computer has been increasing rapidly. Generally, portable electronic apparatuses use data storage apparatuses or memory system that employ memory devices. Data storage apparatuses may be used to store data used in the portable electronic apparatuses.

Data storage apparatuses or memory systems using memory devices have no mechanical driving units and exhibit good stability and endurance, fast information access rate, and low power consumption. Such data storage apparatuses may include a universal serial bus (USB) memory device, a memory card having various interfaces, a universal flash storage (UFS) device, a solid-state drive (SSD), and the like.

SUMMARY

Embodiments of the present invention are directed to a data storage apparatus or a memory system capable of reducing the number of error bits of read data and an operation method thereof.

In an embodiment of the present disclosure, an operation method of a data storage apparatus may include: performing a first read operation using an optimal read voltage on read-failed memory cells; performing an error correction code (ECC) decoding operation on read data read through the first read operation; performing a second read operation using an oversampling read voltage on the read-failed memory cells when the ECC decoding operation to the read data fails; determining whether or not potential error memory cells which are turned on through the optimal read voltage and are turned off through the oversampling read voltage are present in the read data; determining whether or not neighboring memory cells which share a bit line with the potential error memory cells and are coupled to neighboring word lines are in an erased state by performing a read operation on the neighboring memory cells when the potential error memory cells are present and inverting bit values corresponding to the potential error memory cells in the read data read from the read-failed memory cells through the first read operation when the neighboring memory cells are in the erased state.

In another embodiment of the present disclosure, a data storage apparatus may include: a nonvolatile memory device configured to perform a first read operation using an optimal read voltage and a second read operation using an oversampling read voltage on read-failed memory cells; and a controller configured to control the nonvolatile memory device to perform the first read operation and the second read operation, to determine whether or not at least one or more potential error memory cells, which are turned on through the optimal read voltage and turned off through the oversampling read voltage among the read-failed memory cells are present, to determine whether or not neighboring memory cells which share a bit line with the potential error memory cells and are coupled to neighboring word lines are in an erased state by performing a read operation on the neighboring memory cells when the potential error memory cells are present, and to invert bit values corresponding to the potential error memory cells in read data read from the read-failed memory cells through the first read operation when the neighboring memory cells are in the erased state.

According to the embodiments, the number of error bits in read data may be minimized by detecting memory cells having data retention characteristics degraded due to neighboring memory cells in a word line direction among read-failed memory cells and inverting bit values of the detected memory cells. Accordingly, a read fail occurrence rate may be reduced.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . .," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms ark intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

When a drawing or a detailed description describes a multi-layer structure having two or more layers, the relative positional relationship or arrangement order of the illustrated layers just reflects a particular embodiment and does not limit the concept and spirit of the present invention. Also, the drawing or the detailed description of the multi-layer structure may not reflect all the layers existing in a particular multi-layer structure (for example, there may be one or more additional layers between the two illustrated layers). For example, when a first layer is referred to as being "on" a second layer or "on" a substrate, it not only refers to a case where the first layer is formed directly on the second layer or the substrate but also a case where a third layer exists between the first layer and the second layer or between the first layer and the substrate.

Hereinafter, the various embodiments of the present invention will be described in detail with reference to the attached drawings.

Figure 1:
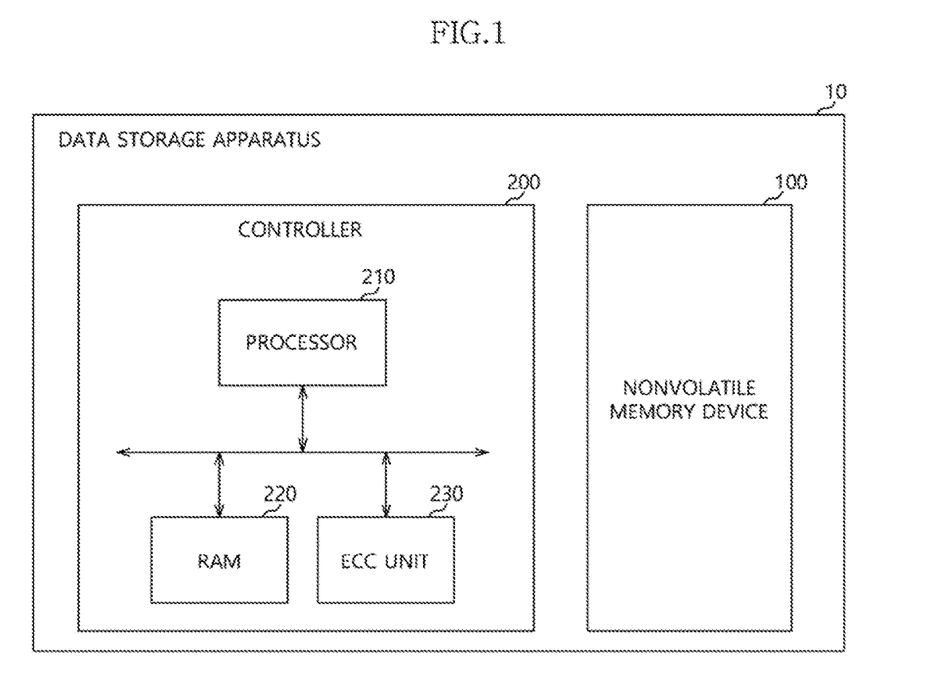
FIG. 1 is a block diagram illustrating a data storage apparatus according to an embodiment of the present disclosure.
Figure 2:
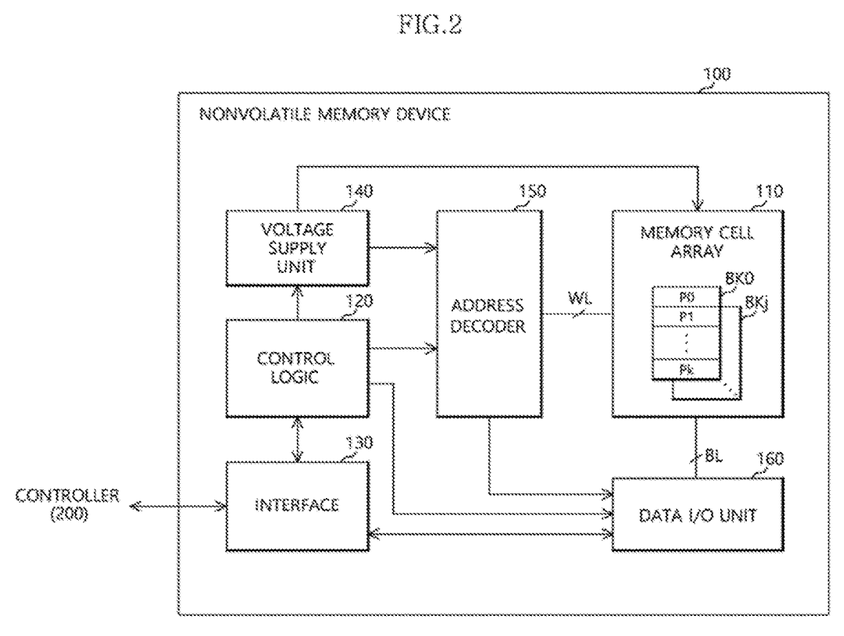
FIG. 2 is a diagram illustrating a nonvolatile memory device shown in FIG. 1.
Figure 3:
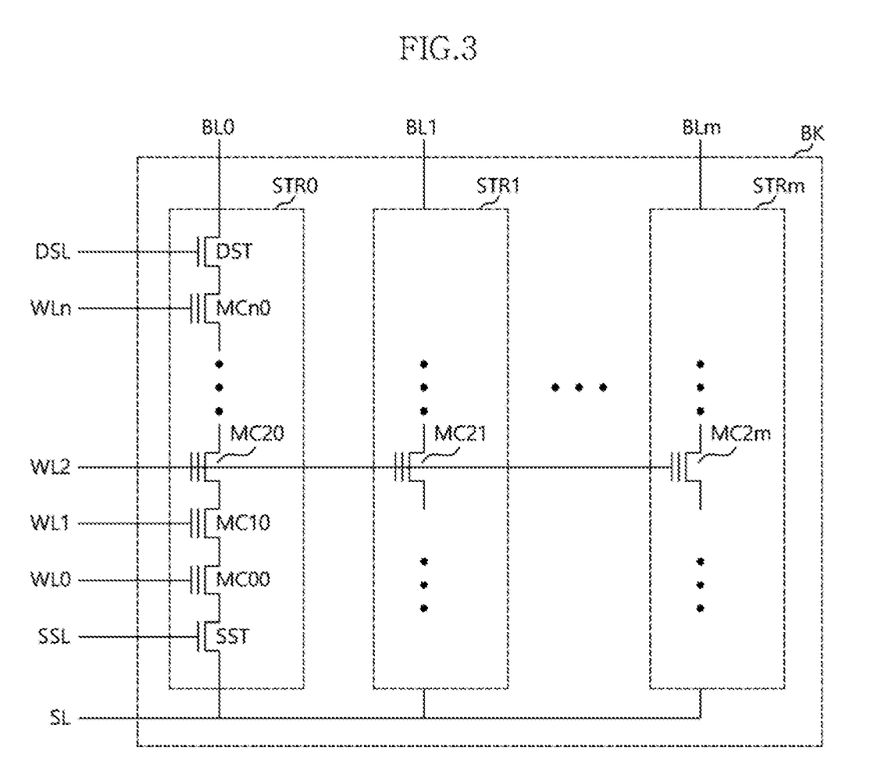
FIG. 3 is a diagram illustrating a memory block shown in FIG. 2.

FIG. 1 is a block diagram illustrating a data storage apparatus according to an embodiment, FIG. 2 is a diagram illustrating a nonvolatile memory device of FIG. 1, and FIG. 3 is a diagram illustrating a memory block of FIG. 2.

Referring to FIG. 1, a data storage apparatus 10 according to an embodiment may store data to be accessed by a host apparatus (not shown) such as a mobile phone, an MP3 player, a laptop computer, a desktop computer, a game player, a television (TV), or an in-vehicle infotainment system, and the like. The data storage apparatus 10 may refer to a memory system.

The data storage apparatus 10 may be manufactured as any one among various types of storage apparatuses according to a protocol of an interface coupled to a host apparatus. For example, the data storage apparatus 10 may be configured of any one of various types of storage apparatuses, such as a solid-state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, and a memory stick, and the like.

The data storage apparatus 10 may be manufactured as any one among various types of packages. For example, the data storage apparatus 10 may be manufactured as any one of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The data storage apparatus 10 may include a nonvolatile memory device 100 and a controller 200.

The nonvolatile memory device 100 may be operated as a storage medium of the data storage apparatus 10. The nonvolatile memory device 100 may include any one of various types of nonvolatile memory devices, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (RERAM) using a transition metal compound.

Referring to FIG. 2, the nonvolatile memory device 100 may include a memory cell array 110, a control logic 120, an interface 130, a voltage supply unit 140, an address decoder 150, and a data input/output (I/O) unit 160.

The memory cell array 110 may be coupled to the address decoder 150 through word lines WL and may be coupled to the data I/O unit 160 through bit lines BL. The memory cell array 110 may include a plurality of memory cells arranged in regions in which the word lines WL and the bit lines BL cross to each other. The memory cell array 110 may have a two-dimensional (2D) structure or a 3D structure.

The memory cell array 110 may include a plurality of memory blocks BK0 to BKj and each of the memory blocks may include a plurality of pages P0 to Pk.

Referring to FIG. 3, the memory block BK may include strings STR0 to STRm. Each of the strings STR0 to STRm may be coupled between a common source line SL and a corresponding bit line. For example, the string STR0 may be coupled between the common source line SL and a bit line BL0.

The strings STR1 to STRm may substantially have the same configuration as the string STR0 and thus the string STR0 will be exemplarily described. The string STR0 may include a drain select transistor DST, memory cells MC00 to MCn0, and a source select transistor SST. A drain of the drain select transistor DST may be coupled to the bit line BL0, and a gate of the drain select transistor DST may be coupled to a drain select line DSL. A source of the source select transistor SST may be coupled to the common source line SL and a gate of the source select transistor SST may be coupled to a source select line SSL. The memory cells MC00 to MCn0 may be coupled in series between the drain select transistor DST and the source select transistor SST. Gates of the memory cells MC00 to MCn0 may be coupled to corresponding word lines WL0 to WLn.

The word lines WL0 to WLn may be coupled to corresponding memory cells of the strings STR0 to STRm. For example, the word line WL2 may be coupled to memory cells MC20 to MC2m included in the strings STR0 to STRm. When a write operation is performed, data may be written in memory cells corresponding to the selected word line. When the word line WL2 is selected, data may be simultaneously written in the memory cells MC20 to MC2m corresponding to the selected word line WL2.

Each of the memory cells may be at least one among a single level cell (SLC) in which a single bit data (for example, 1-bit data) is stored, or a multilevel cell (MLC) in which 2-bit or more-bit data is stored. An MLC storing three-bit data is known as a triple level cell (TLC), and an MLC storing 4-bit data is known as a quad level cell QLC.

The control logic 120 may control an overall operation of the nonvolatile memory device 100 according to control of the controller 200. The control logic 120 may receive commands transmitted from the controller 200 through the interface 130, generate control signals in response to the commands, and provide the generated control signals to internal units of the nonvolatile memory device 100.

The interface 130 may transmit and receive various control signals including a command and an address and pieces of data to and from the controller 200. The interface 130 may transmit the various control signals transmitted from the controller 200 to the control logic 120 and transmit the pieces of data to the data I/O unit 160. The interface 130 may transmit the pieces of data transmitted from the data I/O unit 160 to the controller 200.

The voltage supply unit 140 may generate various operation voltages required for the overall operation of the nonvolatile memory device 100 according to control of the control logic 120. For example, the voltage supply unit 140 may generate a normal read voltage an optimal read voltage, an oversampling read voltage, and the like and provide the generated read voltages to the address decoder 150.

The address decoder 150 may decode an address to select a memory cell to be accessed in the memory cell array 110. The address decoder 150 may selectively drive one or more of the word lines WL based on a decoding result. The address decoder 150 may also control the data I/O unit 160 to selectively drive bit lines BL based on a decoding result.

The data I/O unit 160 may transmit data transmitted from the interface 130 to the memory cell array 110 through the bit lines BL. The data I/O unit 160 may also transmit data read through the bit lines BL from the memory cell array 110 to the interface 130. The data I/O unit 160 may sense a current formed according to the turning-on or off of a corresponding memory cell in the memory cell array 110 in response to a read voltage and acquire data read from the memory cell according to a sensing result.

Referring to FIG. 1, the controller 200 may include a processor 210, a random-access memory (RAM) 220, and an error correction code (ECC) unit 230.

The processor 210 may control an overall operation of the controller 200. The processor 210 may analyze and process a signal, a command, or a request received from a host apparatus (not shown). For example, when a read request and a logical block address (LBA) to be read are received from the host apparatus, the processor 210 may read data from the nonvolatile memory device 100 based on the received logical block address (LBA). When a program request, a logical block address (LBA) to be programed, and data to be programmed are received from the host apparatus, the processor 210 may store data in the nonvolatile memory device 100 based on the received logical block address (LBA). For example, the processor 210 may decode and drive firmware data loaded into the RAM 220. The processor 210 may be implemented with hardware or a combination of hardware and software.

In operation, the processor 210 may control the nonvolatile memory device 100 to perform a first read operation by applying a normal read voltage (see "Vnrd" of FIG. 4A) to memory cells which are requested to be read from the host apparatus. The processor 210 may control the ECC unit 230 to perform ECC decoding operation to first read data read through the first read operation. The processor 210 may determine whether or not the ECC decoding operation to the first read data is successful and then terminate the corresponding read operation when the ECC decoding operation to the first read data is successful.

The processor 210 may control the nonvolatile memory device 100 to perform a second read operation by applying an optimal read voltage (see "Vord" of FIG. 4B) to the read-requested memory cells when the ECC decoding operation to the first read data fails. The processor 210 may detect, based on second read data read through the second read operation, memory cells (hereinafter, referred to as target memory cells) which are turned on by the optimal read voltage Vord among the read-requested memory cells. The processor 210 may control the ECC unit 230 to perform an ECC decoding operation on the second read data read through the second read operation. After the processor 210 determines whether or not the ECC decoding operation to the second read data is successful, the processor 210 may terminate the corresponding read operation when the ECC decoding operation to the second read data is successful.

When the ECC decoding operation fails, the processor 210 may control the nonvolatile memory device 100 to perform a third read operation by applying an oversampling read voltage (see Vsrd of FIG. 4C) to the read-requested memory cells. The processor 210 may determine based on the third read data which are read through the third read operation whether or not potential error memory cells, which are turned off by the oversampling read voltage Vsrd, are present among the target memory cells. When the potential error memory cells are present, the processor 210 may control the nonvolatile memory device 100 to perform a read operation on neighboring memory cells to the potential error memory cells, i.e., memory cells which share a bit line with the potential error memory cells and which are coupled to neighboring word lines. When the potential error memory cells are not present, the processor 210 may terminate the corresponding read operation.

The processor 210 may determine whether or not the neighboring memory cells are in an erased state based on read data read from the neighboring memory cells. When the neighboring memory cells are in the erased state, the processor 210 may invert the bit values of the potential error memory cells in the second read data and control the ECC unit 230 to perform an ECC decoding operation on the second read data in which the bit values of the potential error memory cells are inverted. When the neighboring memory cells are not in the erased state, the process 210 may terminate the corresponding read operation.

In general, when neighboring memory cells to a particular memory cell, i.e., memory cells which share a bit line with the particular memory cell and which are coupled to adjacent word lines to the word line of the particular memory cell are in the erased state, the data retention characteristic of the particular memory cell may be drastically degraded. Accordingly, the threshold voltage distribution of the particular memory cell may become considerably left-shifted and the number of error bits in the read data may be increased.

In the exemplary embodiment, the processor 210 may determine bit values read from memory cells as erroneous when the memory cells turned on by the optimal read voltage Vord are turned off by the oversampling read voltage and when neighboring memory cells of the memory cells are in an erased state. The processor 210 may invert the bit values determined as erroneous. Accordingly the number of error bits in the read data may be reduced.

The RAM 220 may store the firmware data driven through the processor 210. The RAM 220 may store system data required for the driving of the firmware data. For example, the RAM 220 may be operated as a working memory of the processor 210.

The RAM 220 may temporarily store data to be transmitted to the nonvolatile memory device 100 from a host apparatus and data to be transmitted to the host apparatus from the nonvolatile memory device 100. For example, the RAM 220 may be operated as a buffer memory.

The ECC unit 230 may perform an ECC encoding operation on data to be stored in the nonvolatile memory device 100 according to an ECC algorithm. The ECC unit 230 may perform an ECC decoding operation to data read from the nonvolatile memory device 100.

For example, the ECC unit 230 may detect and correct an error bit of the data read from the nonvolatile memory device 100 using a parity bit generated in an encoding process. In this example, the ECC unit 230 may correct the detected error bit when the number of error bits of the read data is equal to or smaller than a preset number and may not correct the detected error bit when the number of error bits of the read data is larger than the preset number. The preset number may be set according to the error correction capacity of the ECC unit 230.

Figure 4A:
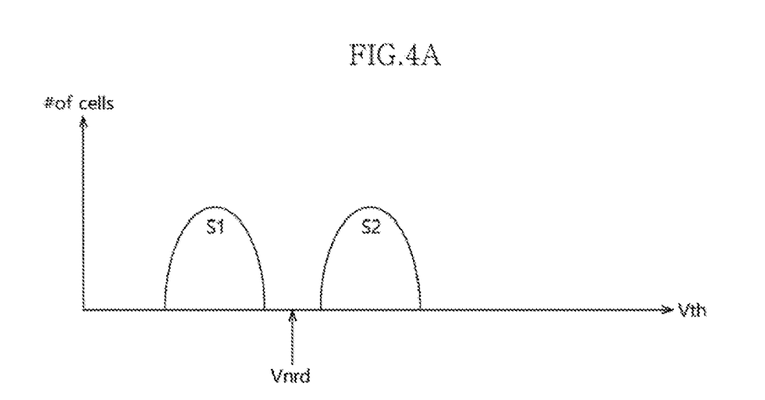
FIG. 4A is a diagram illustrating an example of threshold voltage distribution of a memory cell of FIG. 3 and a read operation to the memory cell using a normal read voltage according to an embodiment of the present disclosure.
Figure 4B:
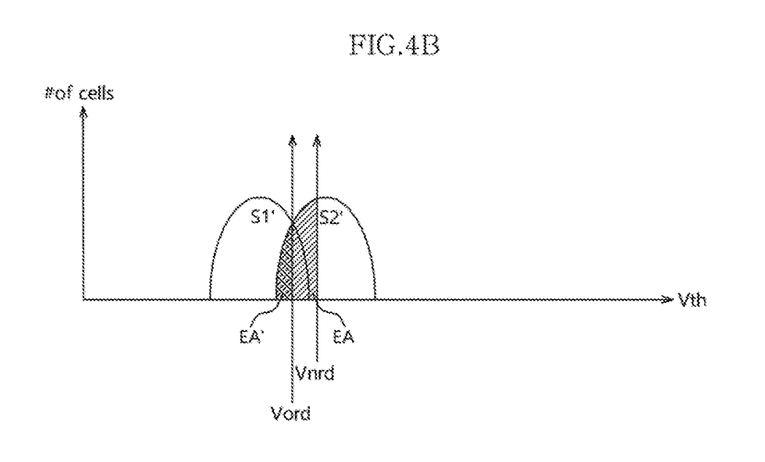
FIG. 4B is a diagram illustrating an example of distorted threshold voltage distribution of the memory cell and a read operation to the memory cell using an optimal read voltage according to an embodiment of the present disclosure.
Figure 4C:
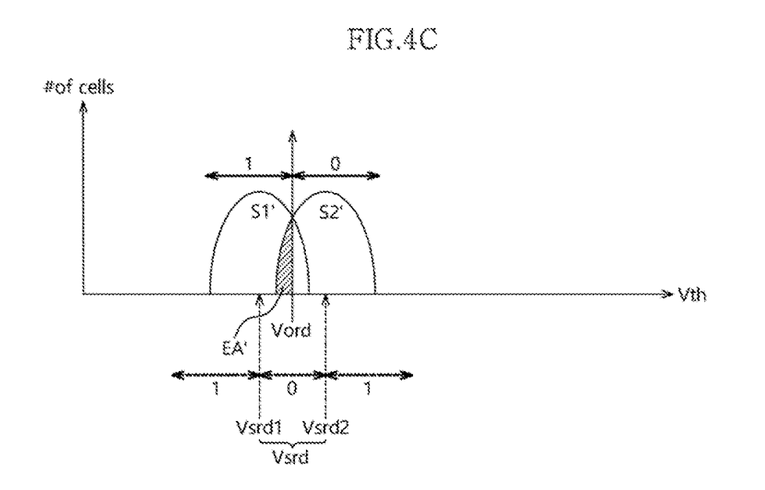
FIG. 4C is a diagram illustrating an example of distorted threshold voltage distribution of the memory cell and a read operation to the memory cell using an oversampling read voltage according to an embodiment of the present disclosure.

FIG. 4A is a diagram illustrating an example of threshold voltage distribution of a memory cell of FIG. 3 and a read operation to the memory cell using a normal read voltage according to an embodiment of the present disclosure; FIG. 4B is a diagram illustrating an example of distorted threshold voltage distribution of the memory cell and a read operation to the memory cell using an optimal read voltage according to an embodiment of the present disclosure; and FIG. 4C is a diagram illustrating an example of a distorted threshold voltage distribution of the memory cell and a read operation to the memory cell using an oversampling read voltage according to an embodiment of the present disclosure. In FIGS. 4A to 4C, the horizontal axis refers to threshold voltages of memory cells and the vertical axis refers to the number of memory cells for each threshold voltage.

Only two states S1 and S2 are illustrated in FIGS. 4A to 4C for clarity. In an embodiment, when the memory cell is a SLC, a first state S1 may refer to an erased state and a second state S2 may refer to a programmed state in FIGS. 4A to 4C. In another embodiment, when the memory cell is an MLC storing 2-bit data, a TLC, or a QLC, the first state S1 may refer to any one of an erased state or any one of programmed states and the second state S2 may refer to any one of the programmed states in FIGS. 4A to 4C. Hereinafter, it is assumed that the first state S1 is the erased state and the second state S2 is the programmed state for clarity.

Referring to FIG. 4A, the memory cell may be erased or programmed to have a threshold voltage distribution corresponding to any one of the erased state S1 and the programmed state S2. During the read operation, the normal read voltage Vnrd having a voltage level between the erased state S1 and the programmed state S2 may be applied to the memory cell. When the normal read voltage Vnrd is applied, the memory cell having the threshold voltage distribution of the erased state S1 may be determined as an on cell which stores data "1" and the memory cell having the threshold voltage distribution of the programmed state S2 may be determined as an off cell which stores data "0". Here, the normal read voltage Vnrd may refer to a preset base read voltage for reading the memory cell.

The threshold voltage distribution of the memory cell illustrated in FIG. 4A may be distorted due to various factors. For example, referring back to FIG. 3, when the memory cells MC00 and MC20 are coupled to word lines (for example the word line WL0 and the word line WL2) adjacent to the word line WL1 to which the memory cell MC10 is coupled and share the same bit line BL0 with the memory cell MC10 and when the memory cells MC00 and MC20 are in an erased state, the data retention characteristic of the memory cell MC10 may be degraded due to the erased memory cells MC00 and MC20 and the threshold voltage distribution of the memory cell MC10 may be distorted as illustrated in FIG. 4B. Accordingly, the normal read voltage Vnrd may be located on the distorted threshold voltage distribution and thus the number of error bits in the data read from the memory cell MC10 may be increased. When the number of error bits exceeds the error correction capability of the ECC unit 230, the ECC unit 230 may not correct errors of the read data resulting in a read fail.

To reduce the number of error bits, the processor may change the normal read voltage Vnrd to the optimal read voltage Vord and may repeat the read operation to the memory cell MC10 using the optimal read voltage Vord as illustrated in FIG. 4B. The optimal read voltage Vord may be provided through the controller 200. The controller 200 may estimate the optimal read voltage Vord in order to reduce the number of error bits caused by the distorted threshold voltage distribution and provide the estimated optimal read voltage Vord to the nonvolatile memory device 100. In an embodiment, the optimal read voltage Vord may correspond to the threshold voltage of the lowest valley point between the threshold voltage distributions of the erased state S1 and programmed state S2, i.e., at the point where the threshold voltage distributions of the erased state S1 and programmed state S2 intersect, however, the present disclosure is not limited thereto.

For example, as exemplified in FIG. 4B, when the data read according to the normal read voltage Vnrd has a number of error bits corresponding to a first error area EA, the data read according to the optimal read voltage Vord may have a number of error bits corresponding to a second error area EA', which is smaller than the first error region EA. Accordingly, the number of error bits may be reduced.

However, when the number of error bits included in the data read according to the optimal read voltage Vord also exceeds the error correction capability of the ECC unit 230, the error correction may still fail resulting in a read fail.

In an embodiment of the present disclosure, in order to minimize the number of error bits, the processor 210 may perform the read operation using the oversampling voltages Vsrd, which are symmetrical to each other with reference to the optimal read voltage Vord, as illustrated in FIG. 4C when the ECC decoding operation to the read data read through the read operation using the optimal read voltage Vord fails and determine whether or not the potential error memory cells turned off in the read operation using the oversampling read voltage Vsrd are present among the target memory cells turned on in the read operation using the optimal read voltage Vord.

For example, the processor 210 may determine whether or not the potential error memory cells having the data bit value "0" according to the oversampling read voltage among the target memory cells having the data bit value "1" according to the optimal read voltage are present.

When the potential error memory cells are present, the processor 210 may determine whether or not the neighboring memory cells which share a bit line with the potential error memory cells and are coupled to neighboring word lines of the potential error memory cells are in an erased state by performing the read operation to the neighboring memory cells. The processor 210 may determine the potential error memory cells as error memory cells when the neighboring memory cells are in the erased state, and invert (i.e., flip) the bit values of the error memory cells from "1" to "0". The processor 210 may flip the bit values of the error memory cells in the read data read according to the optimal read voltage Vord.

Figure 5:
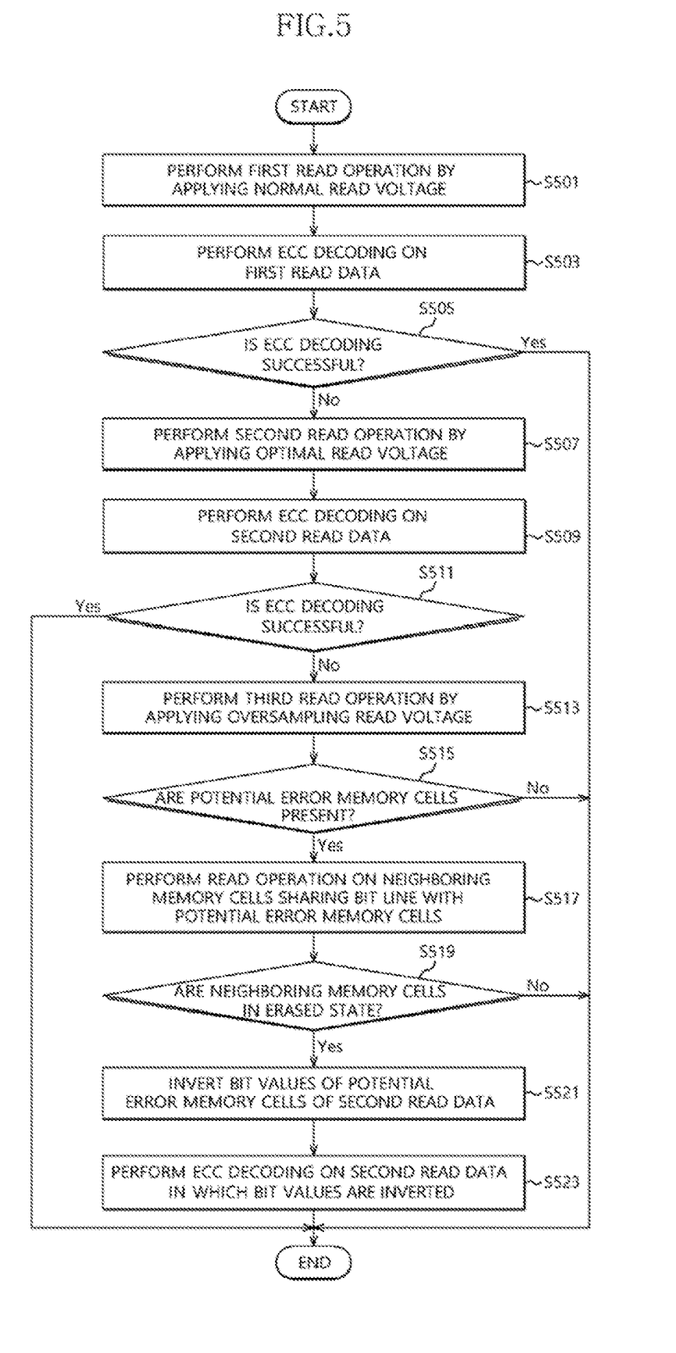
FIG. 5 is a flowchart illustrating an operation method of a data storage apparatus according to an embodiment of the present disclosure.

FIG. 5 is a flowchart illustrating an operation method of the data storage apparatus 10 according to an embodiment.

Referring to FIGS. 1 to 5, in operation S501, when a read request is received from a host apparatus (not shown), the processor 210 of the controller 200 may control the nonvolatile memory device 100 to perform a first read operation to read-requested memory cells according to the normal read voltage Vnrd.

For example, the processor 210 may generate a command based on a read request transmitted from the host apparatus and transmit the generated command to the nonvolatile memory device 100. The nonvolatile memory device 100 may perform the first read operation to the read-requested memory cells according to the normal read voltage Vnrd in response to the command transmitted from the controller 200 and transmit first read data, which are read from the read-requested memory cells, to the controller 200.

In operation S503, the processor 210 may control the ECC unit 230 to perform ECC decoding operation to the first read data transmitted from the nonvolatile memory device 100.

In operation S505, the processor 210 may determine whether or not the ECC decoding operation to the first read data is successful. When the ECC decoding operation to the first read data is successful, the read operation for the corresponding memory cells may be terminated. When the ECC decoding operation to the first read data fails, the processor 210 may proceed to operation S507.

In operation S507, the processor 210 may control the nonvolatile memory device 100 to perform a second read operation to the read-requested memory cells according to the optimal read voltage Vord.

For example, the processor 210 may determine the optimal read voltage Vord in order to minimize the number of error bits based on the threshold voltage distributions of the read-requested memory cells, and may provide a command including information of the optimal read voltage Vord to the nonvolatile memory device 100. The nonvolatile memory device 100 may perform the second read operation to the read-requested memory cells according to the optimal read voltage Vord based on the command transmitted from the controller 200 and transmit second read data, which are read from the corresponding memory cells, to the controller 200. In this example, the processor 210 may detect the memory cells turned on by the optimal read voltage Vord in the second read data, this is, the target memory cells.

In operation S509, the processor 210 may control the ECC unit 230 to perform ECC decoding operation to the second read data transmitted from the nonvolatile memory device 100.

In operation S511, the processor 210 may determine whether or not the ECC decoding operation to the second read data is successful. When the ECC decoding operation to the second read data is successful, the read operation for the corresponding memory cells may be terminated. When the ECC decoding operation to the second read data fails, the processor 210 may proceed to operation S513.

In operation S513, the processor 210 may control the nonvolatile memory device 100 to perform the third read operation to the read-requested memory cells according to the oversampling read voltages Vsrd.

For example, the processor 210 may determine the oversampling read voltages Vsrd, which are symmetrical to each other with reference to of the optimal read voltage Vord. The oversampling read voltages Vsrd may include a first oversampling read voltage Vsrd1 located in a negative direction from the optimal read voltage Vord and a second oversampling read voltage Vsrd2 located in a positive direction from the optimal read voltage Vord. The processor 210 may provide a command including information of the oversampling read voltages Vsrd to the nonvolatile memory device 100. The nonvolatile memory device 100 may perform the third read operation to the read-requested memory cells according to the oversampling read voltages Vsrd in response to the command transmitted from the controller 200 and transmit third read data, which are read from the read-requested memory cells, to the controller 200.

In operation S515, the processor 210 may determine whether or not the potential error memory cells turned off by the oversampling read voltages Vsrd are present among the target memory cells based on the third read data transmitted from the nonvolatile memory device 100. When the potential error memory cells are not present, the processor may terminate the read operation for the corresponding memory cells. When the potential error memory cells are present, the processor may proceed to operation S517.

In operation S517, the processor 210 may control the nonvolatile memory device 100 to perform the read operation to neighboring memory cells which share a bit line with the potential error memory cells and are coupled to neighboring word lines of the potential error memory cells.

For example, the processor 210 may generate a command for performing the read operation to the neighboring memory cells and transmit the command to the nonvolatile memory device 100. The nonvolatile memory device 100 may perform the read operation to the neighboring memory cells according to a read voltage, for example, the normal read voltage Vnrd in response to the transmitted command and transmit pieces of read data, which are read from the neighboring memory cells, to the controller 200.

In operation S519, the processor 210 may determine whether or not the neighboring memory cells are in an erased state based on the pieces of read data read from the neighboring memory cells. When the neighboring memory cells are not in the erased state, the processor may terminate the read operation on the read-requested memory cells. When the neighboring memory cells are in the erased state, the processor may proceed to operation S521.

In operation S521, the processor 210 may invert bit values corresponding to the potential error memory cells in the second read data read from the read-requested memory cells according to the optimal read voltage Vord. For example, the processor may detect memory cells having the data value "0" according to the oversampling read voltages Vsrd among the memory cells having the data bit value "1" according to the optimal read voltage Vord, and change the data bit values of the detected memory cells, for example, from "1" to "0" in the second read data when the neighboring memory cells which share a bit line with the detected memory cells and are adjacent to the detected memory cells to a word line direction are in the erased state.

In operation S523, the processor 210 may perform an ECC decoding operation on the second read data in which the bit values of the potential error memory cells are inverted.

Figure 6:
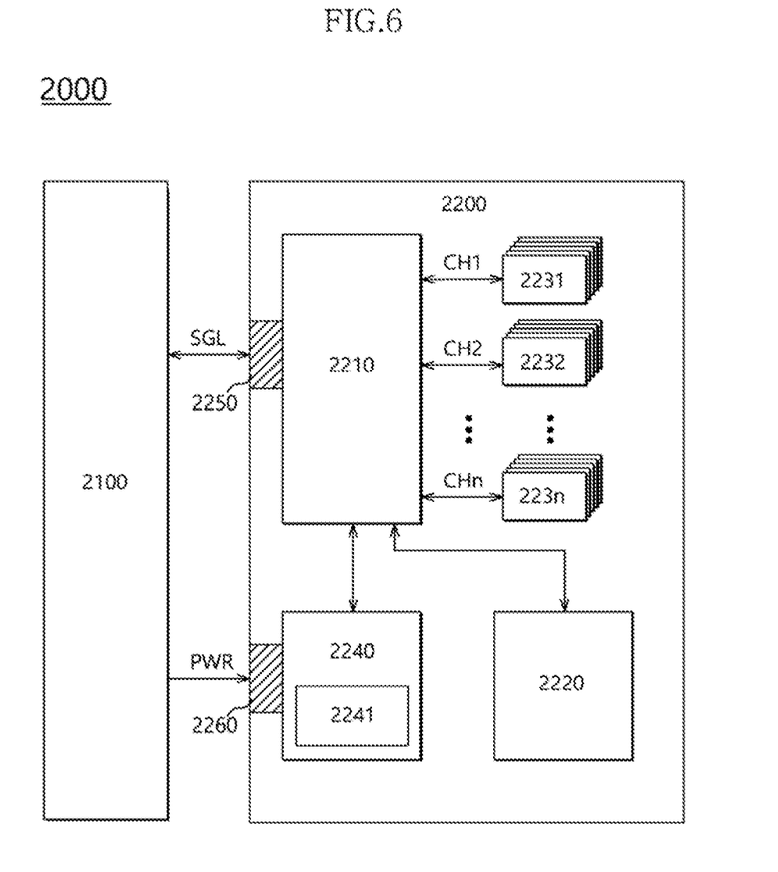
FIG. 6 is a diagram illustrating an example of a data processing system including a solid-state drive (SSD) according to an embodiment of the present disclosure.

FIG. 6 is a diagram illustrating an example of a data processing system including a solid-state drive (SSD) according to an embodiment. Referring to FIG. 6, a data processing system 2000 may include a host apparatus 2100 and a SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PMR.

The controller 2210 may exchange a signal SGL with the host apparatus 2100 through the signal connector 2250. The signal SQL may include a command, an address, data, and the like. The signal connector 2250 may be configured of various types of connectors according to an interfacing method between the host apparatus 2100 and the SSD 2200.

Figure 7:
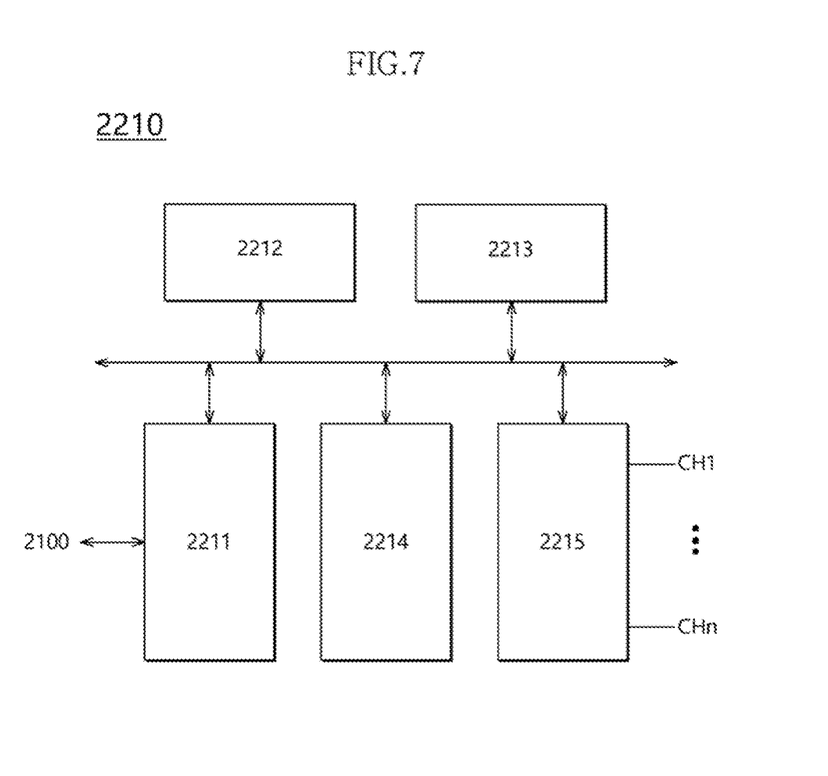
FIG. 7 is a diagram illustrating an example of a controller illustrated in FIG. 6.

FIG. 7 is a diagram illustrating an example of the controller 2210 of FIG. 6. Referring to FIG. 7, the controller 2210 may include a host interface unit 2211, a control unit 2212, a random-access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL received from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 8:
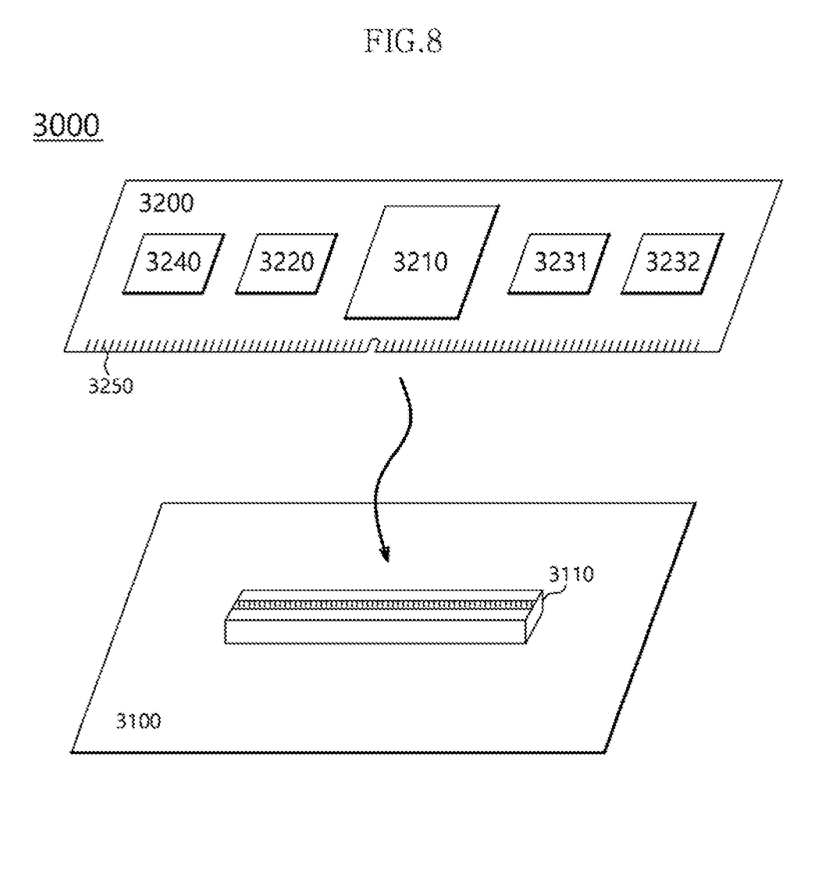
FIG. 8 is a diagram illustrating an example of a data processing system including a data storage apparatus according to an embodiment of the present disclosure.

FIG. 8 is a diagram illustrating an example of a data processing system including a data storage apparatus according to an embodiment. Referring to FIG. 8, a data processing system 3000 may include a host apparatus 3100 and a data storage apparatus 3200.

The host apparatus 3100 may be configured in a board form such as a printed circuit board (PCB). Although not shown in FIG. 9, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 7.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3210 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 9:
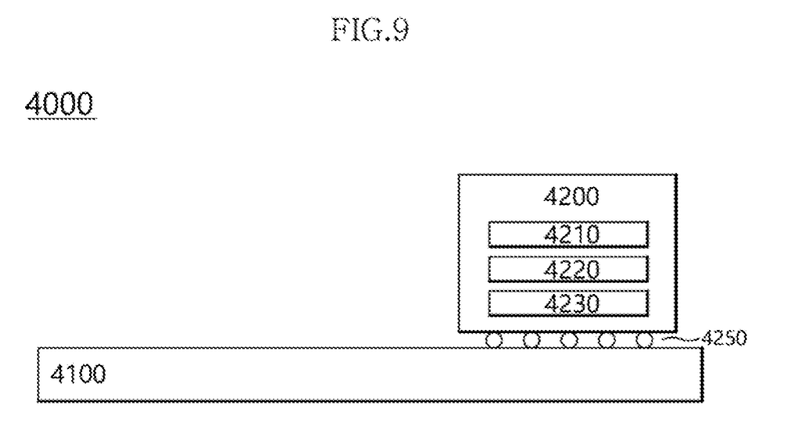
FIG. 9 is a diagram illustrating an example of a data processing system including a data storage apparatus according to an embodiment of the present disclosure.

FIG. 9 is a diagram illustrating an example of a data processing system including a data storage apparatus according to an embodiment. Referring to FIG. 9, a data processing system 4000 may include a host apparatus 4100 and a data storage apparatus 4200.

The host apparatus 4100 may be configured in a board form such as a PCB. Although not shown in FIG. 10, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 7.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 according to control of the controller 4210.

The nonvolatile memory device 4230 may be used as a storage medium of the data storage apparatus 4200.

Figure 10:
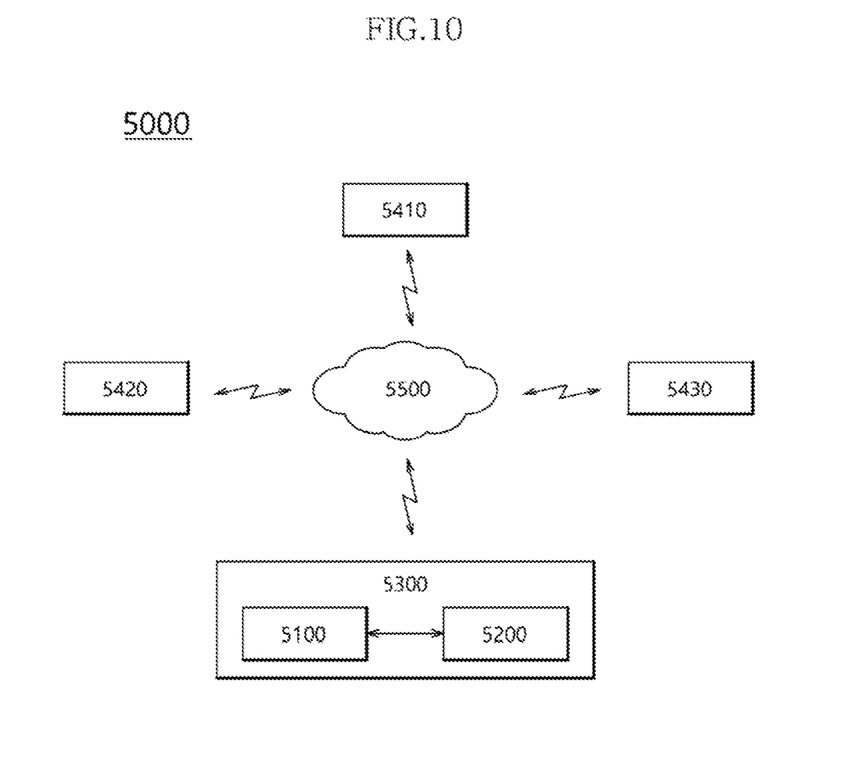
FIG. 10 is a diagram illustrating an example of a network system including a data storage apparatus according to an embodiment of the present disclosure.

FIG. 10 is a diagram illustrating an example of a network system 5000 including a data storage apparatus according to an embodiment. Referring to FIG. 10, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and the data storage apparatus 5200. The data storage apparatus 5200 may be configured of the data storage apparatus 10 of FIG. 1 the data storage apparatus 2200 of FIG. 6, the data storage apparatus 3200 of FIG. 8 or the data storage apparatus 4200 of FIG. 9.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. An operation method of a data storage apparatus, the method comprising:
   performing a first read operation using an optimal read voltage on read-failed memory cells;
   performing an error correction code (ECC) decoding operation on read data read through the first read operation;
   performing a second read operation using an oversampling read voltage on the read-failed memory cells when the ECC decoding operation to the read data fails;
   determining whether or not potential error memory cells which are turned on through the optimal read voltage and are turned off through the oversampling read voltage are present in the read data;
   determining whether or not neighboring memory cells which share a bit line with the potential error memory cells and are coupled to neighboring word lines are in an erased state by performing a read operation on the neighboring memory cells when the potential error memory cells are present; and
   inverting bit values corresponding to the potential error memory cells in the read data read from the read-failed memory cells through the first read operation when the neighboring memory cells are in the erased state.

2. The method of claim 1, further comprising, before the performing of the first read operation:
   performing a normal read operation on memory cells using a normal read voltage;
   performing an ECC decoding operation on read data read from the memory cells through the normal read operation; and
   determining whether or not the ECC decoding operation is successful.

3. The method of claim 2,
   wherein the normal read voltage is preset to be located between threshold voltage distributions of the read-failed memory cells,
   wherein the optimal read voltage is determined on the basis of distorted threshold voltage distributions of the read-failed memory cells, and
   wherein the oversampling read voltages are symmetrically located with reference to the optimal read voltage in the threshold voltage distributions of the read-failed memory cells.

4. The method of claim 1, further comprising terminating the read operation to the read-failed memory cells when the potential error memory cells are not present as a result of the determining of whether or not the potential error memory cells are present.

5. The method of claim 1, further comprising terminating the read operation to the read ailed memory cells when the neighboring memory cells are not in the erase state as a result of the determining of whether or not the neighboring memory cells are in the erase state.

6. The method of claim 1, further comprising performing an ECC decoding operation on the read data in which the bit values of the potential error memory cells are inverted after the inverting of the bit values corresponding to the potential error memory cells in the read data.

7. A data storage apparatus comprising:
   a nonvolatile memory device configured to perform a first read operation using an optimal read voltage and a second read operation using an oversampling read voltage on read-failed memory cells; and
   a controller configured to control the nonvolatile memory device to perform the first read operation and the second read operation to determine whether or not at least one or more potential error memory cells, which are turned on through the optimal read voltage and turned off through the oversampling read voltage, are present among the read-failed memory cells, to determine whether or not neighboring memory cells which share a bit line with the potential error memory cells and are coupled to neighboring word lines are in an erased state by performing a read operation on the neighboring memory cells when the potential error memory cells are present, and to invert bit values corresponding to the potential error memory cells in read data read from the read-failed memory cells through the first read operation when the neighboring memory cells are in the erased state.

8. The data storage apparatus of claim 7, wherein the controller controls the nonvolatile memory device to perform an error correction code (ECC) decoding operation on the read data read from the memory cells through the first read operation and perform the second read operation on the memory cells when the ECC decoding operation to the read data fails.

9. The data storage apparatus of claim 7, wherein the controller controls the nonvolatile memory device to terminate the read operation to the memory cells when the potential error memory cells are not present.

10. The data storage apparatus of claim 7, wherein the controller controls the nonvolatile memory device to terminate the read operation to the memory cells when the neighboring memory cells are not in an erase state.

11. The data storage apparatus of claim 7, wherein the controller performs an error correction code (ECC) decoding operation on the read data in which the bit values of the potential error memory cells are inverted.

12. The data storage apparatus of claim 7, wherein the controller controls the nonvolatile memory device to perform a normal read operation using a normal read voltage on the memory cells, perform an error correction code (ECC) decoding operation on normal read data read from the memory cells through the normal read operation, and controls the nonvolatile memory device to perform the first read operation on the memory cell when the ECC decoding operation to the memory cells fails.

13. The data storage apparatus of claim 12, wherein the normal read voltage is preset to be located between threshold voltage distributions of the read-failed memory cells,
   wherein the optimal read voltage is determined on the basis of distorted threshold voltage distributions of the read-failed memory cells, and
   wherein the oversampling read voltages are symmetrically located with reference to the optimal read voltage in the threshold voltage distributions of the read-failed memory cells.

* * * * *